(12) United States Patent
Scollo et al.

(10) Patent No.: US 7,053,678 B2
(45) Date of Patent: May 30, 2006

(54) DRIVING CIRCUIT FOR A CONTROL TERMINAL OF A BIPOLAR TRANSISTOR IN AN EMITTER-SWITCHING CONFIGURATION AND CORRESPONDING METHOD FOR REDUCING THE VCESAT DYNAMIC PHENOMENON

(75) Inventors: Rosario Scollo, Misterbianco (IT); Simone Buonomo, Augusta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 28 days.

(21) Appl. No.: 10/794,788

(22) Filed: Mar. 5, 2004

(65) Prior Publication Data
US 2004/0217801 A1    Nov. 4, 2004

(51) Int. Cl.
*H03K 3/00*    (2006.01)
(52) U.S. Cl. ........................... 327/108; 327/478
(58) Field of Classification Search ........ 327/108–112, 327/478, 482; 326/64–67, 82, 84, 85
See application file for complete search history.

(56) References Cited

U.S. PATENT DOCUMENTS

| 4,695,770 | A | 9/1987 | Raets | 315/207 |
|---|---|---|---|---|
| 5,399,913 | A * | 3/1995 | Widener et al. | 327/108 |
| 6,154,069 | A * | 11/2000 | Ebihara | 327/112 |

OTHER PUBLICATIONS

Self-Optimizing Low Energy Drive Circuit for Emitter-Switched Transistor, IBM Technical Disclosure Bulletin, IBM Corp., New York, US, vol. 39, No. 1, 1996, pp. 151-160, XP000556356.

* cited by examiner

*Primary Examiner*—Kenneth B. Wells

(74) *Attorney, Agent, or Firm*—Lisa K. Jorgenson; Allen, Dyer, Doppelt, Milbrath & Gilchrist, P.A.

(57) ABSTRACT

A driving circuit is provided for a control terminal of a bipolar transistor in an emitter-switching configuration. The emitter-switching configuration is between first and second voltage references. The driving circuit includes at least one first resistive element connected to the control terminal of the bipolar transistor and a first capacitor connected to the resistive element with respect to a first circuit node and to the second voltage reference. The driving circuit further includes a Zener diode connected between the first circuit node and a second circuit node, and a second capacitor between the second circuit node and the second voltage reference.

31 Claims, 6 Drawing Sheets

DRIVING CIRCUIT FOR A CONTROL TERMINAL OF A BIPOLAR TRANSISTOR IN AN EMITTER-SWITCHING CONFIGURATION AND CORRESPONDING METHOD FOR REDUCING THE VCESAT DYNAMIC PHENOMENON

FIELD OF THE INVENTION

The present invention relates to a driving circuit for a control terminal of a bipolar transistor in an emitter-switching configuration, and to a corresponding method for driving the same.

BACKGROUND OF THE INVENTION

An emitter-switching circuit configuration comprises a cascode connection of a bipolar transistor having a high breakdown voltage, and a low voltage power MOSFET transistor. Such a configuration is schematically shown in FIG. 1 and is indicated with reference numeral 1. The emitter-switching configuration 1 comprises a bipolar transistor T1 and a MOS transistor M1 cascode-connected together between first and second voltage references, particularly the supply voltage Vcc and ground GND.

The emitter-switching configuration 1 provides that the bipolar transistor T1 is of the HV (High Voltage) type, i.e., a high breakdown voltage transistor, while the MOS transistor M1 is of the LV (Low Voltage) type, i.e. a low breakdown voltage transistor. The bipolar transistor T1 has a collector terminal connected to the supply voltage reference Vcc via an inductive load L1, and a control or base terminal connected to a driving circuit 2. The MOS transistor M1 has a control or gate terminal connected to the driving circuit 2.

The driving circuit 2 comprises a first resistive element RB connected to the base terminal of the bipolar transistor T1, and a Zener diode DZ connected to ground GND. A second resistive element RG is connected to the gate terminal of the MOS transistor M1, and to ground GND via a voltage pulse generator G1. An electrolytic capacitor CB is connected in parallel with the Zener diode DZ, and has across its terminals a voltage equal to VB.

In particular, the electrolytic capacitor CB has the function of storing energy during the bipolar transistor T1 turn-off so that it can be reused during a following turn-on and conduction step of the transistor itself. This is while the Zener diode prevents the base voltage value of the bipolar transistor T1 from exceeding a predetermined threshold.

The emitter-switching is particularly interesting at the present time due to the marketing of bipolar transistors having a square RBSOA (Reverse Biased Safe Operating Area) with a current near the peak current. It also has a voltage equal to the breakdown voltage BVCES between the collector and emitter terminals when the base terminal is short-circuited with the emitter terminal [Breakdown Voltage Collector-Emitter Short], as well as of MOS power transistors having a very low drain-source resistance value in conduction conditions, $R_{DSON}$ and being thus almost similar to ideal switches.

The main advantages of an emitter-switching configuration are an extremely low in-conduction voltage drop (typical of bipolar transistors.) and a high turn-off speed, as readily known by those skilled in the art. When turning off, the current output from the bipolar transistor base terminal is equal to the collector terminal current of this transistor, i.e., a very high current. This causes a drastic reduction both of the storage time and of the fall time, allowing the emitter-switching configuration to operate even at frequencies of 150 kHz.

The driving performed through the driving circuit 2 is very useful and effective in all cases in which the current in the emitter-switching configuration 1 is zero, or very small with respect to the nominal current in the turn-on step.

However, for this driving to be effective, it is necessary that the base current value in the turn-off step $I_{BOFF}$, multiplied by the storage time $t_{storage}$, is near the base current value in the conduction step $I_{BON}$, multiplied by the turn-on time $t_{on}$. In other words:

$$I_{BOFF} * t_{storage} \approx I_{BON} * t_{ON}$$

This condition usually occurs when operating at relatively high frequencies and with not too high currents, or better yet, when the bipolar transistor gain value hfe is not too low.

In this case, the driving energy required for the conduction is slightly higher than the energy recovered during the turn-off. It is thus sufficient to supply the base terminal with a very low power to replace inevitable losses.

FIG. 2 shows the trend of voltage VGS values between the gate and source terminals of the MOS transistor M1, of the voltage between the bipolar transistor collector terminal and the MOS transistor source terminal VCS, and of the base and collector currents of the bipolar transistor T1 with reference to a flyback converter operating at a frequency of 100 kHz and having a zero turn-on current since the converter operates discontinuously.

When operating with applications where the current value on the emitter-switching configuration 1 in the turn-on step is not zero, and at frequencies higher than around sixty kHz, the phenomenon of the dynamic VCESAT voltage between the bipolar transistor collector and emitter terminals involves excessive power dissipations. This phenomenon is based upon when the emitter-switching configuration turns on, and there is a certain delay before reaching the static VCESAT voltage value. It is thus necessary to overflow with carriers the bipolar transistor base region as fast as possible to make the VCESAT voltage value decrease and reach the steady value as soon as possible.

It is evident that the higher the bipolar transistor operating frequency, then the more relevant is this phenomenon. The need for a high turn-on base current is in contrast with the need for a reasonable saturation in the turn-off step. In fact, the benefits of an improved turn-on current-voltage crossing would be lost in the turn-off step.

For this reason the need arises for a particular modulation of the bipolar transistor base current in the emitter-switching configuration, which allows both switching steps (turn-on and turn-off) to be optimized and the minimum VCESAT voltage value to be reached.

SUMMARY OF THE INVENTION

In view of the foregoing background, an object of the present invention is to provide a driving circuit for an emitter-switching configuration, with the driving circuit having structural and functional characteristics so that the base current of the bipolar transistor can be correctly modulated, thus overcoming the limits and drawbacks still effecting prior art driving circuits.

This and other objects, advantages and features in accordance with the present invention are based upon providing at least one pair of voltage values to the bipolar transistor base terminal in the emitter-switching configuration.

One aspect of the present invention comprises a driving circuit for a control terminal of a bipolar transistor in an emitter-switching configuration between first and second voltage references. The driving circuit comprises a first resistive element connected between a control terminal of the bipolar transistor and a first circuit node, and a first capacitor connected between the first circuit node and the second voltage reference. A Zener diode may be connected between the first circuit node and a second circuit node, and a second capacitor may be connected between the second circuit node and the second reference voltage.

Another aspect of the present invention is directed to a method for driving a control terminal of a bipolar transistor in an emitter-switching configuration between first and second voltage references based upon a driving circuit as described above. The method comprises applying a first voltage to the control terminal of the bipolar transistor via the first capacitor, and applying a second voltage to the control terminal of the bipolar transistor via the second capacitor, with the second voltage being less than the first voltage.

BRIEF DESCRIPTION OF THE DRAWINGS

The features and advantages of the driving circuit and associated methods according to the present invention will be apparent from the following description of an embodiment thereof given by way of a non-limiting example with reference to the attached drawings. In the drawings.

DETAILED DESCRIPTION OF THE PREFERRED EMBODIMENTS

Figure 3:
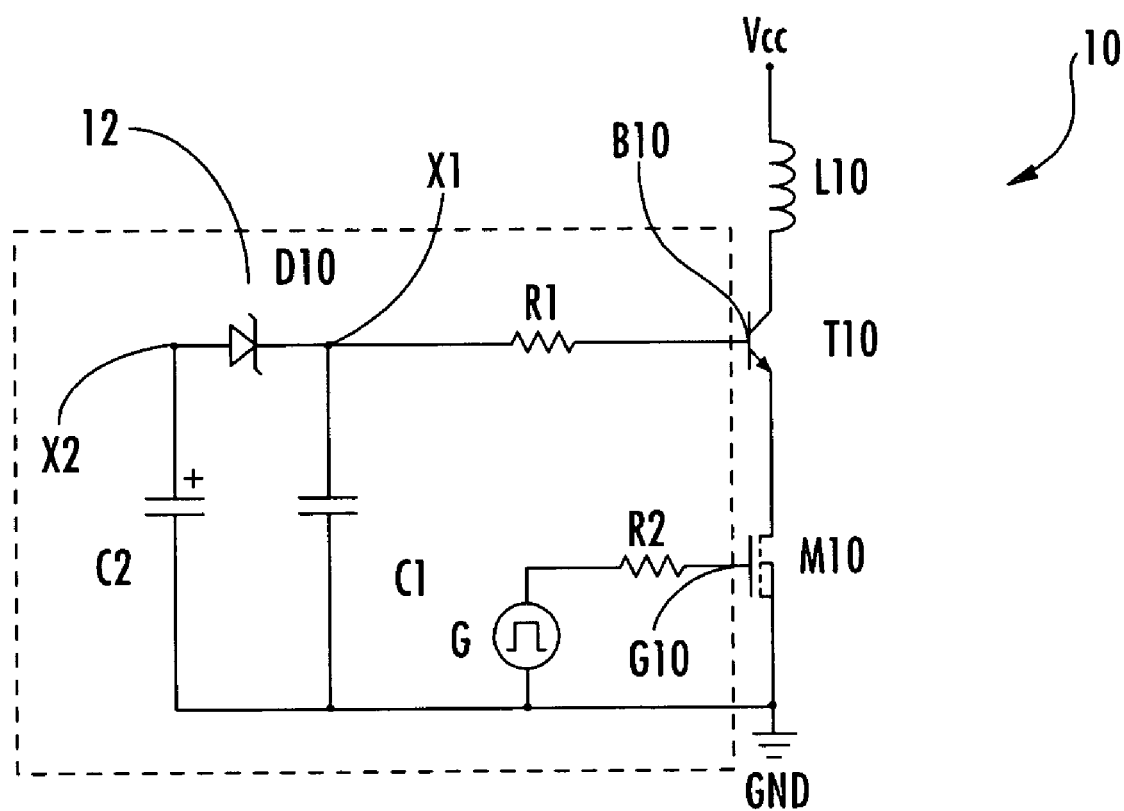
FIG. 3 schematically shows a driving circuit for a bipolar transistor in the emitter switching configuration according to the present invention.

With reference to the figures, and particularly to FIG. 3, a known emitter-switching configuration associated to a driving circuit 12 according to the present invention is being schematically indicated with reference numeral 10.

As discussed above, the emitter-switching configuration 10 comprises a bipolar transistor T10 and a MOS transistor M10 cascode-connected together. The emitter-switching configuration 10 is between first and second voltage references, particularly the supply voltage Vcc and ground GND. The emitter-switching configuration 10 provides that the bipolar transistor T10 is of the HV (High Voltage) type, i.e., a high breakdown voltage transistor, while the MOS transistor M10 is of the LV (Low Voltage) type, i.e., a low breakdown voltage transistor.

The bipolar transistor T10 has a collector terminal connected to the supply voltage reference Vcc via an inductive load L10, and a control or base terminal B10 connected to the driving circuit 12. The MOS transistor M10 has a control or gate terminal G10 connected to the driving circuit 12.

The driving circuit 12 comprises a first resistive element R1 connected to the base terminal B10 of the bipolar transistor T10, and a second resistive element R2 connected to the gate terminal G10 of the MOS transistor M10, and to ground GND via a voltage pulse generator G10.

The driving circuit 12 comprises a first and a second capacitor C1 and C2, as well as a Zener diode D10. In particular, this second capacitor C2 is of the electrolytic type. The first capacitor C1 is connected to the first resistive element R1 (in correspondence with a first circuit node X1) and to ground GND. Similarly, the second capacitor C2 is connected to a second circuit node X2 and to ground GND. As shown in FIG. 3, the second capacitor C2 has the positive plate connected to the second circuit node X2.

Moreover, the Zener diode D10 is inserted between the first X1 and the second X2 circuit nodes, and particularly, it has a cathode terminal connected to the first circuit node X1 and an anode terminal connected to the second circuit node X2.

Still referring to FIG. 3, the driving method according to the present invention will now be discussed. In particular, the control terminal B10 of the bipolar transistor T10 in the emitter-switching configuration (10) is to be driven. The method comprises applying a first voltage value V1 to the control terminal B10 using the first capacitor C1, and applying a second voltage value V2 to the control terminal B10 using the second capacitor C2. The first voltage value V1 is higher than the second voltage value V2.

The second voltage value V2 is kept constant by the second capacitor C2, while the first voltage value V1 varies based upon varying the value of the first capacitor C1 and the Zener diode D10.

As discussed in greater detail below, the driving circuit 12 is optimal from a performance and cost point of view, wherein its simplicity and efficacy being its strong points. The driving circuit 12 is particularly effective in the following conditions: frequencies higher than 60 kHz; relatively low duty cycle (>30%); and current IC on the bipolar transistor collector terminal being different from zero in the turn-on step.

The above-mentioned conditions are those in which the problem of the dynamic VCESAT voltage between the collector and emitter terminals becomes considerable. In fact, at high frequency and with a low duty cycle, the total conduction time is very short, and adding to it a non-zero value of the collector current when turning on, the voltage VCE between the collector and emitter terminals has difficulty in reaching the saturation value, unless, when turning on, the current IB of the base terminal is particularly high.

The driving circuit 12 according to the invention allows a starting peak of the base current IB to be as high as desired to be obtained, while the emitter-switching configuration 10 ensures a turn-off current $I_{BOFF}$ to be as high, and thus small tstorage storage time values.

The voltage value V2 on the second circuit node X2 is kept constant, due to the presence of the second capacitor C2, while the highest voltage value V1 on the first circuit node X1 is caused to vary according to need, by acting on the values of the first capacitor C1 and of the Zener diode D10.

In particular, since it is necessary to obtain a very high base current value IB during the turn-on, it is required that the voltage V1 is higher than V2 during the turn-on. To attain this purpose, through the driving circuit 12, it is sufficient to choose a relatively low value of the first capacitor C1. For example, for operating frequencies between 60 and 150 kHz the value of the first capacitor C1 is preferably chosen between 680 and 180 nF. For an operating frequency of 100 kHz, the value of the first capacitor C1 can be chosen between 200 and 300 nF.

The highest possible value of the base current IB during the turn-on depends on the value of this first capacitor C1, as well as the duration of the starting current spike. The lower the value of the first capacitor C1, the shorter the duration of this spike.

Moreover, the value of the resistive element R1 connected to the base terminal B10 of the bipolar transistor T10 is advantageously chosen low (0.33 Ω), and it contributes to determining the base current IB both during the turn-on and in the conduction step.

The main advantage of the driving circuit 12 according to the invention are thus: control of the highist value of the base current IB of the bipolar transistor T10 by controlling the highest voltage value on the first capacitor C1; total energy recovery when turning off; and structural simplicity of the circuit itself.

The driving circuit 12 allows the current IB of the base terminal B10 of the bipolar transistor T10 to be controlled by the Zener diode D10 which sets precisely the highest voltage value V1 on the first circuit node X1 (with respect to the voltage value V2 on the second circuit node X2), which determines the base current IB peak.

Moreover, the value of the resistive element R1 connected to the base terminal B10 of the bipolar transistor T10 is advantageously chosen low (0.33Ω), and it contributes to determining the base current IB both during the turn-on and in the conduction step.

The main advantages of the driving circuit 12 according to the invention are thus: control of the highest value of the base current IB of the bipolar transistor T10 by controlling the highest voltage value on the first capacitor C1; total energy recovery when turning off; and structural simplicity of the circuit itself.

Another important advantage of the driving circuit 2 is the possibility to vary the voltage V2 on the second circuit node X2, with a negligible influence on the turn-on base current IB, in order to vary the highest value during the conduction. This sets the saturation condition of the emitter-switching configuration 10.

To verify the operation of the driving circuit 12 with an emitter-switching configuration 10 as described, the Applicant has performed a simulation in a forward converter operating at a frequency of 110 kHz, with a duty cycle, at the highest operating power, slightly higher than 20% and with a higher turn-on current ICturn-ON than the turn-off current ICOFF.

The results obtained are indicated in FIGS. 4, 6, 8 and 10 while FIGS. 5, 7, 9 and 11 represent by way of comparison the waveforms corresponding to a traditional driving circuit.

Figure 1:
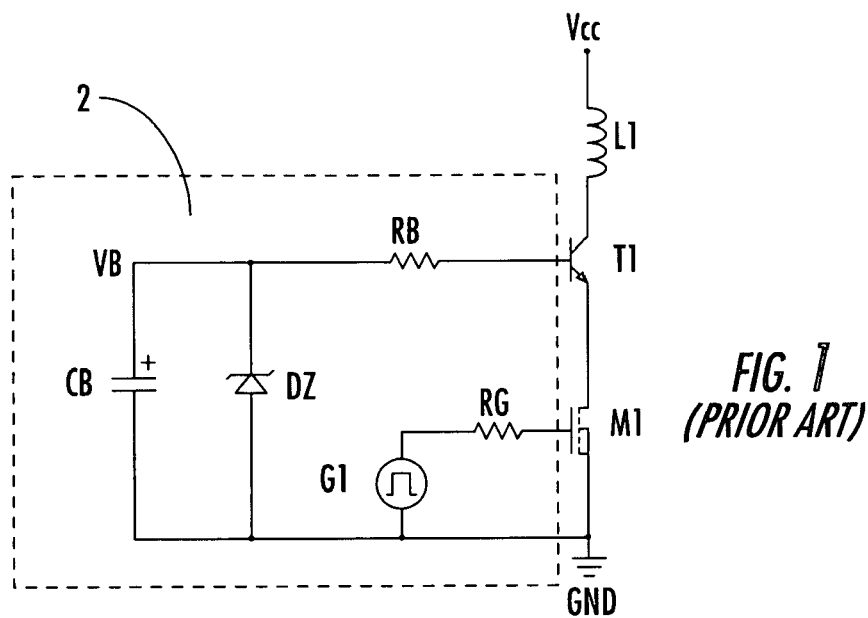
FIG. 1 schematically shows a driving circuit for an emitter-switching configuration according to the prior art.
Figure 2:
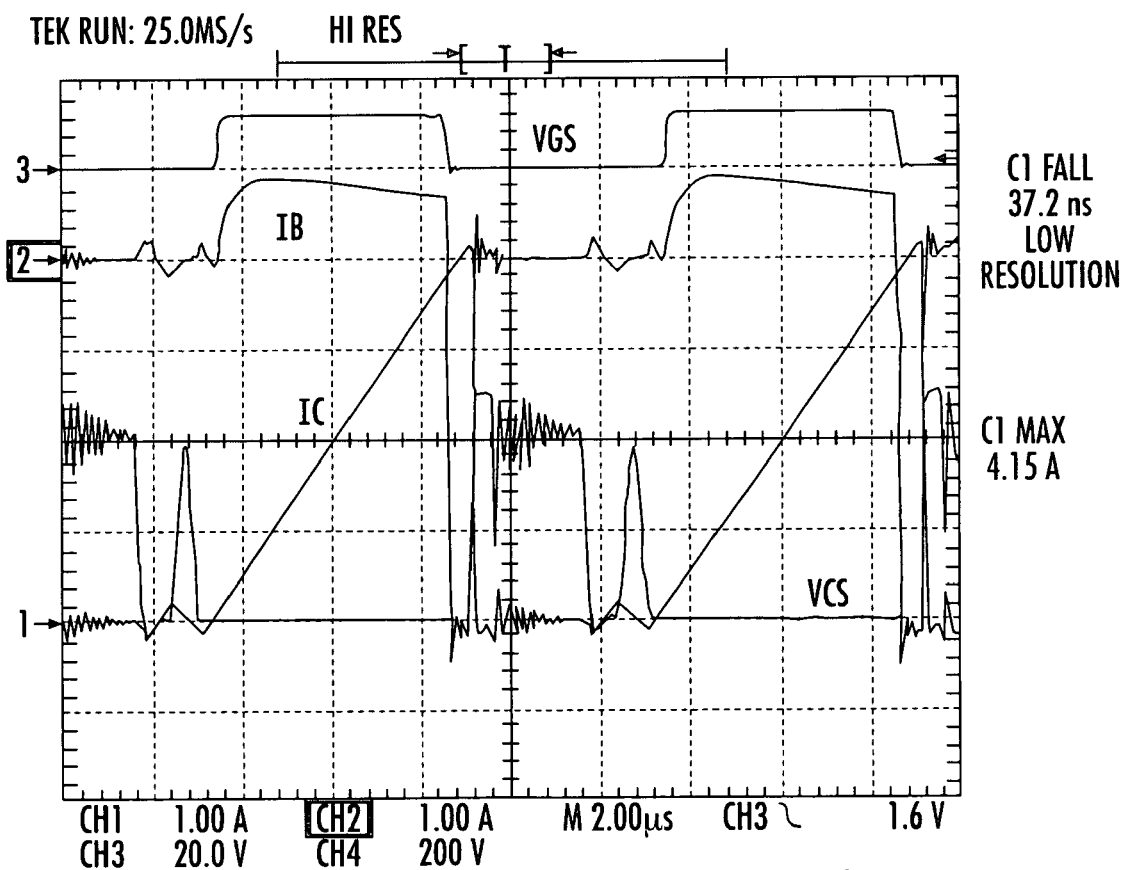
FIG. 2 schematically shows the trend of waveforms typical of a discontinuous flyback converter according to the prior art.
Figure 4:
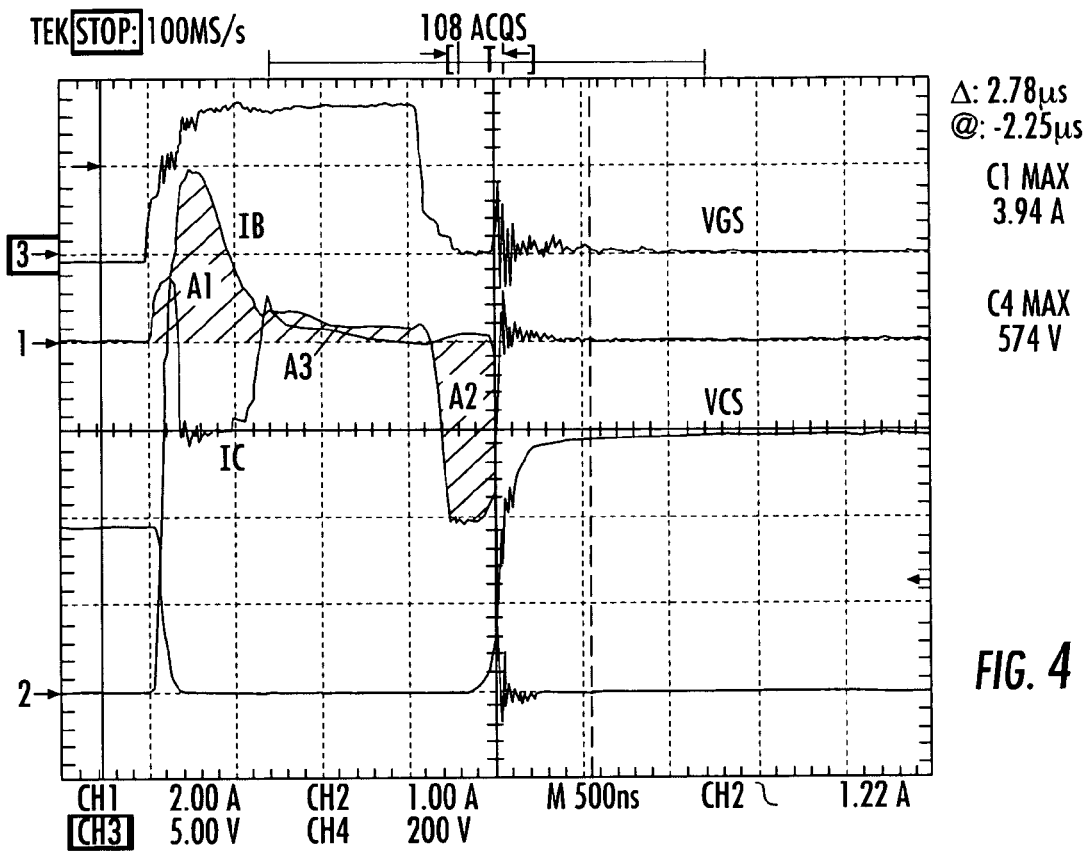
FIG. 4 shows the trend of waveforms obtained with the driving circuit as shown in FIG. 3.
Figure 5:
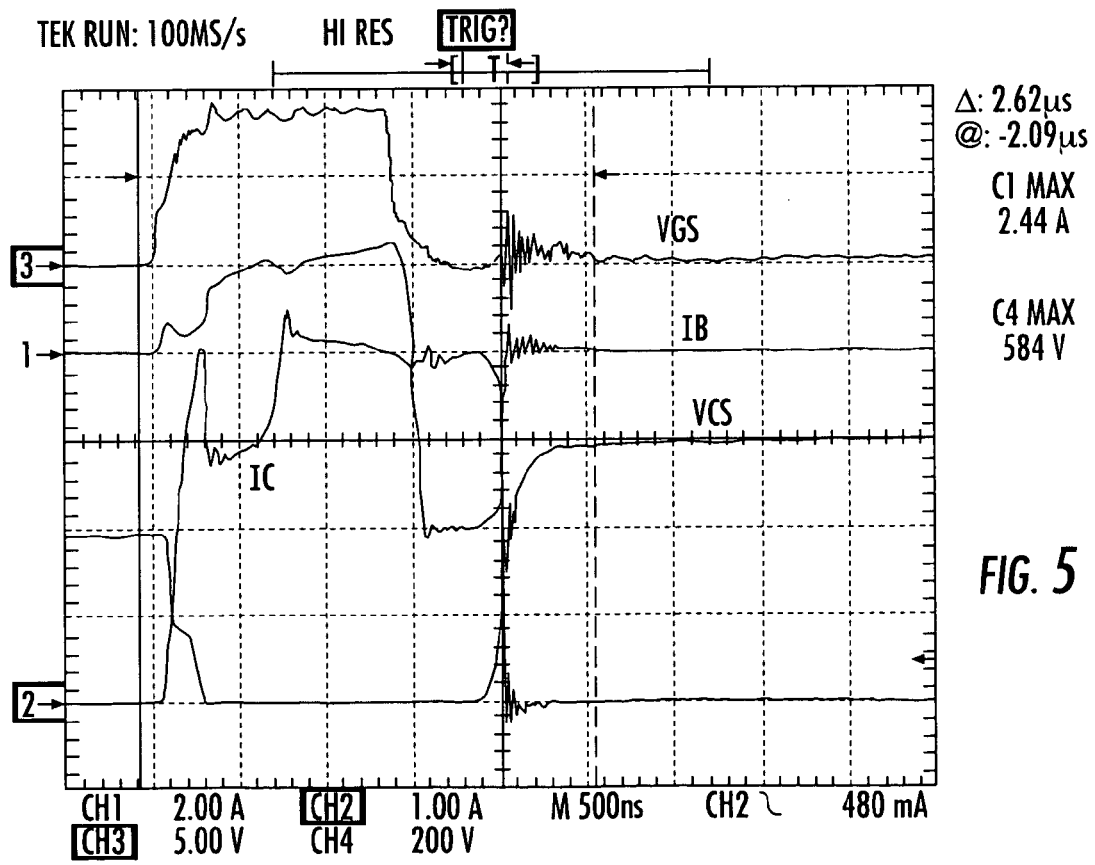
FIG. 5 shows waveforms obtained with the driving circuit as shown in FIG. 1.

In particular, FIG. 4 represents the waveforms obtained by driving the emitter-switching configuration by the driving circuit 12 according to the invention as shown in FIG. 3, while FIG. 5 represents the waveforms corresponding to a same emitter-switching configuration 1 driven by a driving circuit according to the prior art as shown in FIG. 1.

It can be thus verified that the trend of the base current IB shown in FIG. 4 allows the emitter-switching configuration to be rapidly turned on, and the desired saturation level to be reached. This is possible through the two voltage levels V1 and V2 applied to the bipolar transistor base terminal B10, generated by the driving circuit 12 according to the invention.

From a comparison with the current represented in FIG. 5, it is evident that the turn-on step is clearly better with the driving circuit 12 according to the invention. Moreover, the supply voltage applied to the base terminal (VB) is higher in the traditional driving circuit than voltage V2. This leads to a higher storage time, and thus to a slower emitter-switching configuration turn-off.

With the driving circuit 2 according to the prior art, by supplying the base terminal with a slightly lower voltage value, an improved emitter-switching configuration turn-off could be obtained, but only to the detriment of a further deterioration of the already terrible current-voltage crossing in the turn-on step.

The dissipated power for driving the base terminal is very low with the driving circuit 12 according to the invention, as it is in the case of the known driving circuits. The amount of charge supplied during the turn-on step is almost equal to the one recovered during the turn-off step.

Still referring to FIG. 4, the integration area A1 is almost equal to the integration area A2. In other words, the amount of charge which must be provided through an external supply is the only one represented by the integration area A3.

Figure 6:
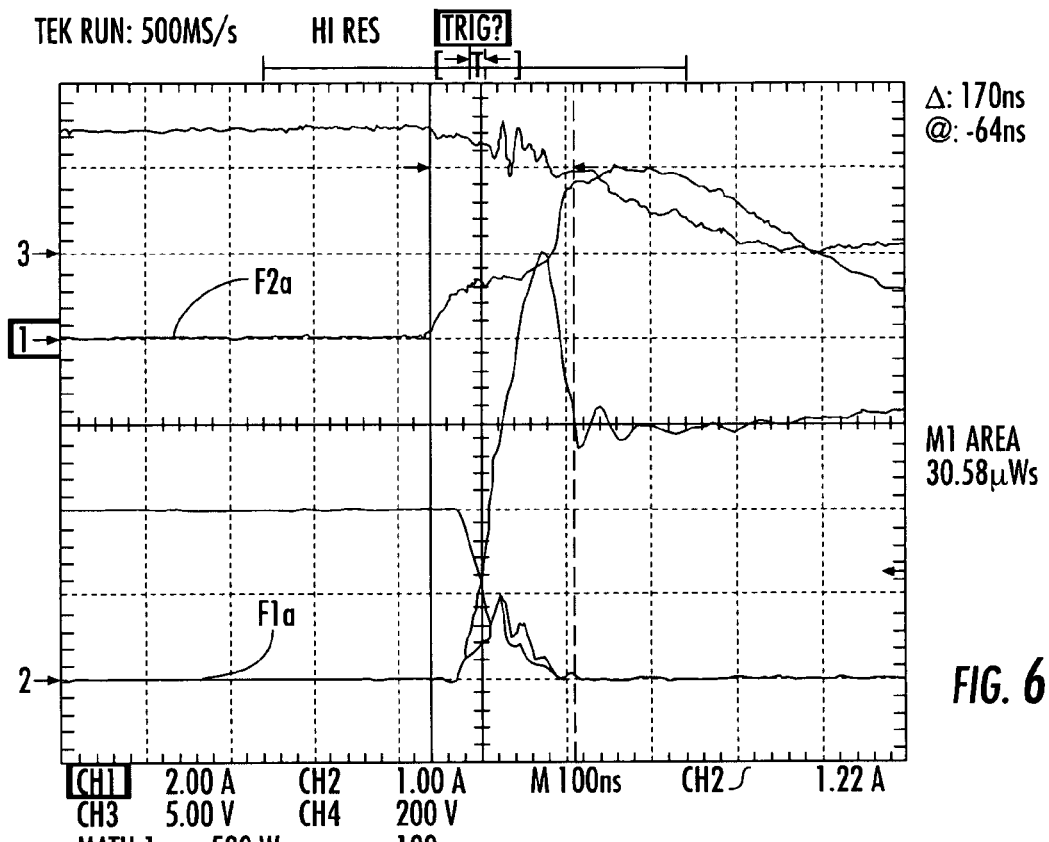
FIG. 6 shows waveforms in the turn-on step of the driving circuit as shown in FIG. 3.
Figure 7:
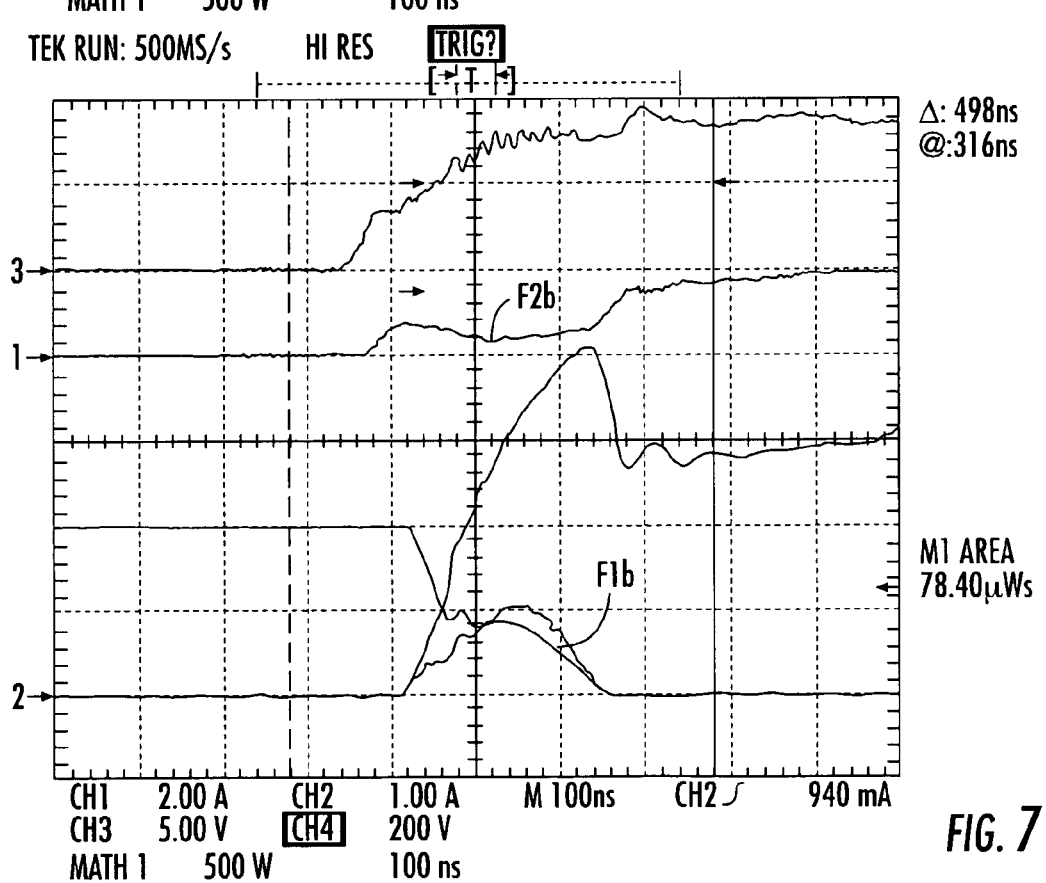
FIG. 7 shows waveforms in the turn-on step of the driving circuit as shown in FIG. 1.

FIGS. 6 and 7 represent the waveforms corresponding particularly to the turn-on of the two driving circuits of FIGS. 3 and 1 respectively. Waveforms F1a and F1b are the instantaneous power dissipated by the emitter-switching configuration, i.e., the product between the voltage VCS and the collector current IC. The area defined by these curves is thus an energy, and more particularly, the energy dissipated during the turn-on. With the driving circuit 12 according to the invention, it is possible to obtain a reduction to almost one third in both the turn-on time and the energy dissipated at the turn-on.

Waveforms F2a and F2b are instead the base terminal current. In particular, FIG. 6 shows how the Vb value which, at the turn-on, leads to a very high base current value IB, starts and then decreasing to finally reach the steady value equal to V1 less the voltage drop on the Zener diode D10. At the same time, the base current IB, after reaching the maximum, decreases so as to stabilize at the value set just by V2 (as shown also in FIG. 4).

Moreover, the dynamic VCESAT phenomenon, which involves the problem of the excessive turn-on dissipation, also effects the losses during the conduction step. Without the turn-on base current IB spark, by driving the bipolar transistor with the driving circuit 2 according to the prior art, the voltage VCE between the collector and emitter terminals does not succeed in reaching the static VCESAT value in less than 2÷3 μs.

Figure 8:
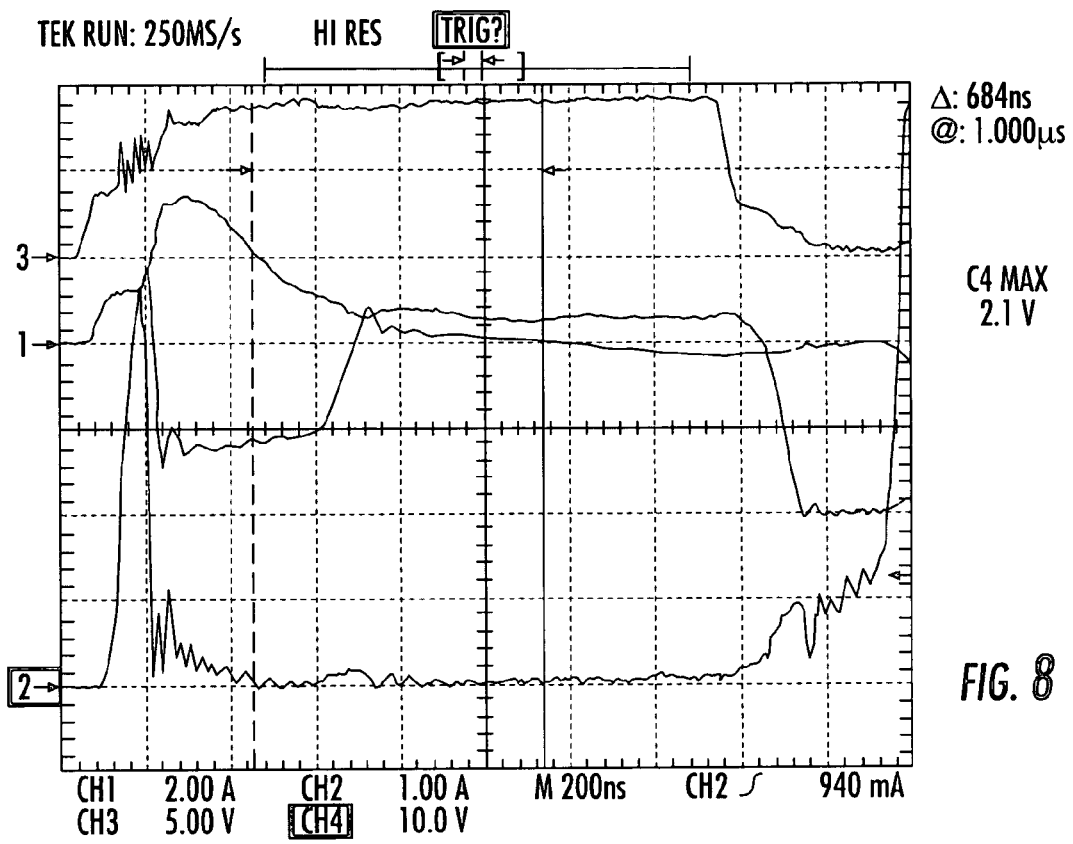
FIG. 8 shows the voltage trend between the bipolar transistor collector terminal and the MOS transistor source terminal (VCS) of an emitter-switching configuration associated with the driving circuit as shown in FIG. 3.
Figure 9:
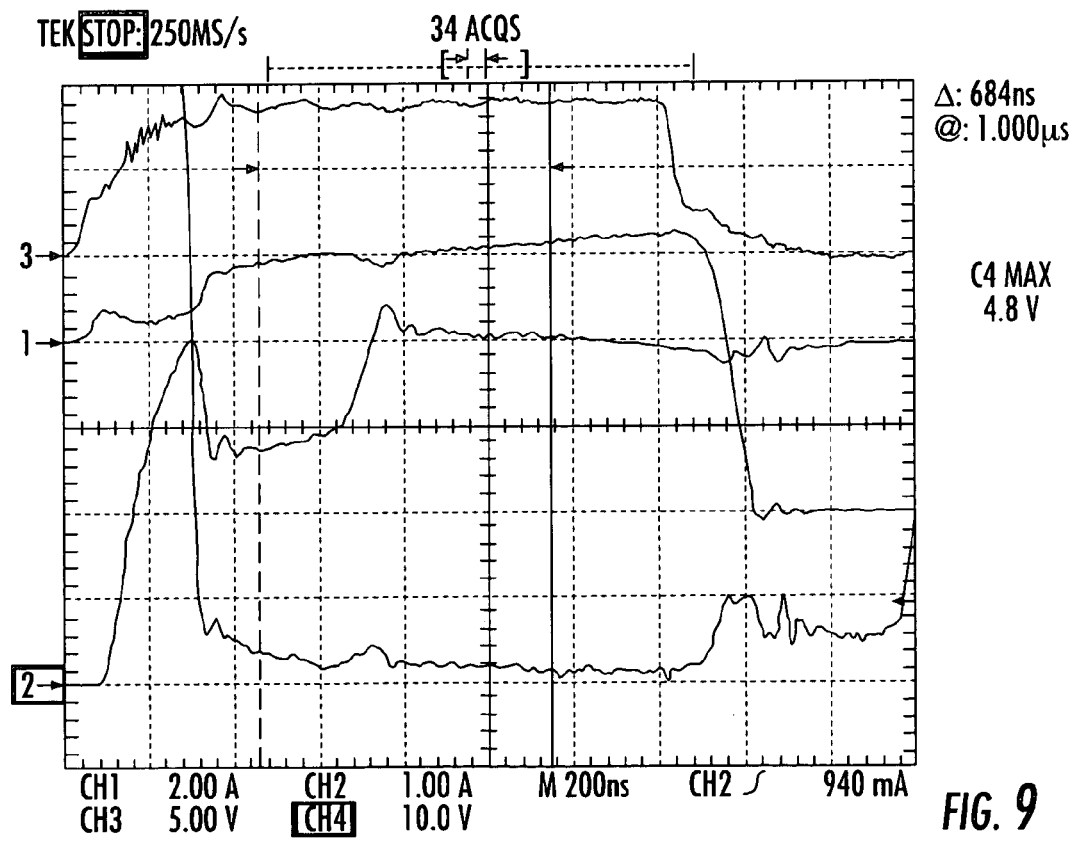
FIG. 9 shows the voltage trend between the bipolar transistor collector terminal and the MOS transistor source terminal (VCS) of an emitter-switching configuration associated with the known driving circuit of FIG. 1.

With reference to FIGS. 8 and 9, it is possible to note how the voltage VCS value determined by the driving circuit 12 according to the invention reaches the static value in little more than 200 ns (FIG. 8). When the driving circuit 2 according to the prior art is used, the voltage VCS does not succeed in reaching the static value before the following turn-off of the emitter-switching configuration.

To avoid any misunderstanding, it is specified that, the voltage VCS is equal to the voltage VCE between the collector and emitter terminals since the following relation applies:

$$VCS=VCE+VDSON$$

and since the voltage VDSON reaches very rapidly the steady value.

Figure 10:
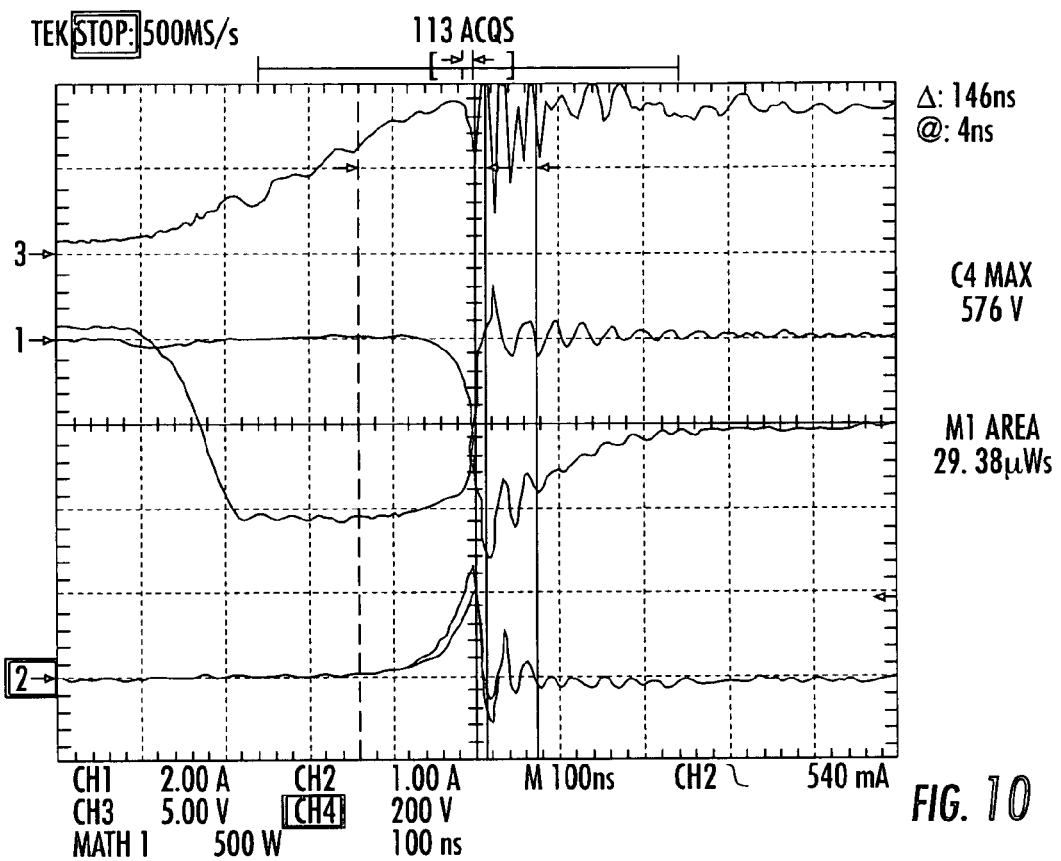
FIG. 10 shows waveforms in the turn-off step of the driving circuit as shown in FIG. 3.
Figure 11:
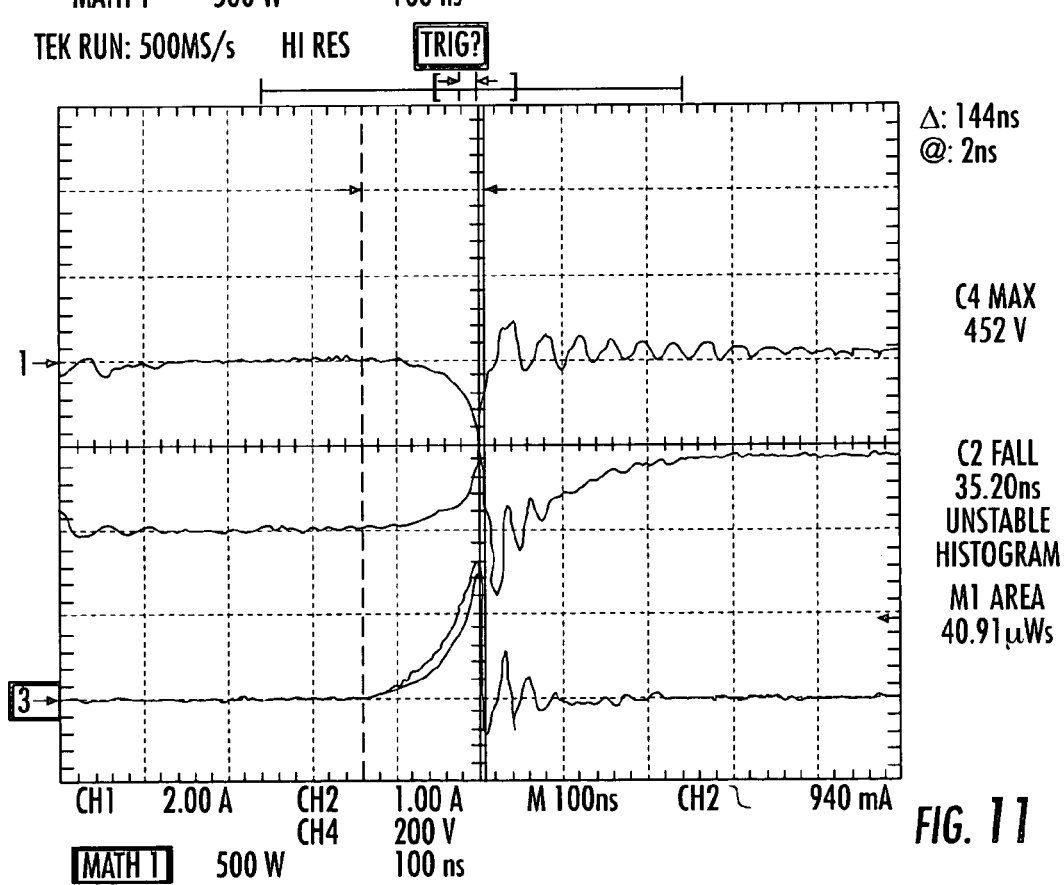
FIG. 11 shows the waveforms in the turn-off step of the driving circuit as shown in FIG. 1.

From the simulations performed, differences in the power dissipated in the turn-off step arise, as can be observed from the trends represented in FIGS. 10 and 11. In particular, the known driving circuit 2 involves a slower turn-off, with an increase both in the storage time and in the fall time. This leads, as a consequence, to a deterioration of the current-voltage crossing and thus to a higher turn-off dissipation.

That which is claimed is:

1. A driving circuit for a control terminal of a bipolar transistor in an emitter-switching configuration between first and second voltage references, the driving circuit comprising:
    a first resistive element having a first terminal directly connected to the control terminal of the bipolar transistor, and a second terminal directly connected to a first circuit node;
    a first capacitor having a first terminal directly connected to the first circuit node, and a second terminal directly connected to the second voltage reference;
    a Zener diode having a first terminal directly connected to the first circuit node, and a second terminal directly connected to a second circuit node; and
    a second capacitor connected between the second circuit node and the second reference voltage.

2. A driving circuit according to claim 1, wherein said first capacitor has a value lower than a value of said second capacitor.

3. A driving circuit according to claim 1, wherein the first terminal of said Zener diode is a cathode terminal and the second terminal is an anode terminal.

4. A driving circuit according to claim 1, wherein said second capacitor comprises an electrolytic capacitor.

5. A driving circuit according to claim 1, wherein said second capacitor has a positive plate connected to the second circuit node.

6. A driving circuit according to claim 1, wherein said first capacitor has a value within a range of about 680 and 180 nF for operating frequencies within a range of about 60 and 150 kHz.

7. A driving circuit according to claim 1, wherein said first resistive element has a value less than 0.5 ohms.

8. A driving circuit according to claim 1, wherein the emitter-switching configuration further comprises a MOS transistor cascode-connected between an emitter of the bipolar transistor and the second voltage reference.

9. A circuit comprising:
    a MOS transistor and a bipolar transistor cascode-connected therewith, said MOS transistor and said bipolar transistor to be connected between first and second voltage references; and
    a driving circuit for a control terminal of the bipolar transistor, and comprising
        a firer resistive element connected between the control terminal of the bipolar transistor and a first circuit node,
        a first capacitor connected between the first circuit node and the second voltage reference,
        a Zener diode connected between the first circuit node and a second circuit node, and
        a second capacitor connected between the second circuit node and the second reference voltage.

10. A circuit according to claim 9, wherein said first capacitor has a value lower than a value of said second capacitor.

11. A circuit according to claim 9, wherein said Zener diode has a cathode terminal connected to the first circuit node and an anode terminal connected to the second circuit node.

12. A circuit according to claim 9, wherein said second capacitor comprises an electrolytic capacitor.

13. A circuit according to claim 9, wherein said second capacitor has a positive plate connected to the second circuit node.

14. A circuit according to claim 9, wherein said first capacitor has a value within a range of about 680 and 180 nF for operating frequencies within a range of about 60 and 150 kHz.

15. A circuit according to claim 9, wherein said first resistive element has a value less than 0.5 ohms.

16. An apparatus comprising:
    a load connected to a first voltage reference;
    a MOS transistor and a bipolar transistor cascode-connected therewith, said bipolar transistor also connected to said load and said MOS transistor also connected to a second voltage reference; and
    a driving circuit for a control terminal of the bipolar transistor, and comprising
        a first resistive element connected between the control terminal of the bipolar transistor and a first circuit node,
        a first capacitor connected between the first circuit node and the second voltage reference,
        a Zener diode connected between the first circuit node and a second circuit node, and
        a second capacitor connected between the second circuit node and the second reference voltage.

17. An apparatus according to claim 16, wherein said first capacitor has a value lower than a value of said second capacitor.

18. An apparatus according to claim 16, wherein said Zener diode has a cathode terminal connected to the first circuit node and an anode terminal connected to the second circuit node.

19. An apparatus according to claim 16, wherein said second capacitor comprises an electrolytic capacitor.

20. An apparatus according to claim 16, wherein said second capacitor has a positive plate connected to the second circuit node.

21. An apparatus according to claim 16, wherein said first capacitor has a value within a range of about 680 and 180 nF for operating frequencies within a range of about 60 and 150 kHz.

22. An apparatus according to claim 16, wherein said first resistive element has a value less than 0.5 ohms.

23. A method for driving a control terminal of a bipolar transistor in an emitter-switching configuration between first and second voltage references based upon a driving circuit comprising a first resistive element having a first terminal directly connected to the control terminal of the bipolar transistor and a second terminal directly connected to a first circuit node, a first capacitor having a first terminal directly connected to the first circuit node, and a second terminal directly connected to the second voltage reference, a Zener diode having a first terminal directly connected to the first circuit node, and a second terminal directly connected to a second circuit node, and a second capacitor connected between the second circuit node and the second reference voltage, the method comprising:

applying a first voltage to the control terminal of the bipolar transistor via the first capacitor; and applying a second voltage to the control terminal of the bipolar transistor via the second capacitor, the second voltage being less than the first voltage.

24. A method according to claim 23, wherein the second voltage is kept constant by the second capacitor.

25. A method according to claim 23, wherein the first voltage varies based upon varying a value of the first capacitor and the Zener diode.

26. A method according to claim 23, wherein the first capacitor has a value lower than a value of the second capacitor.

27. A method according to claim 23, wherein the Zener diode has a cathode terminal connected to the first circuit node and an anode terminal connected to the second circuit node.

28. A method according to claim 23, wherein the second capacitor comprises an electrolytic capacitor.

29. A method according to claim 23, wherein the second capacitor has a positive plate connected to the second circuit node.

30. A method according to claim 23, wherein the first capacitor has a value wherein a range of about 680 and 180 nF for operating frequencies within a range of about 60 and 150 kHz.

31. A method according to claim 23, wherein the first resistive element has a value less than 0.5 ohms.

* * * * *

UNITED STATES PATENT AND TRADEMARK OFFICE
CERTIFICATE OF CORRECTION

PATENT NO. : 7,053,678 B2
APPLICATION NO. : 10/794788
DATED : May 30, 2006
INVENTOR(S) : Rosario Scollo and Simone Buonomo It is certified that error appears in the above-identified patent and that said Letters Patent is hereby corrected as shown below:

Cover page (30)   Insert: -- Foreign Application Priority Data
                          Europe .......03425140.5 ........March 5, 2003 --

Column 5, Line 28   Delete: "highist"
                    Insert: -- highest --

Column 7, Line 65   Delete "a firer"
                    Insert: -- a first --

Signed and Sealed this

Second Day of January, 2007

JON W. DUDAS
*Director of the United States Patent and Trademark Office*